United States Patent
Lee et al.

(10) Patent No.: US 9,315,891 B2
(45) Date of Patent: Apr. 19, 2016

(54) METHODS FOR PROCESSING A SUBSTRATE USING MULTIPLE SUBSTRATE SUPPORT POSITIONS

(71) Applicant: APPLIED MATERIALS, INC., Santa Clara, CA (US)

(72) Inventors: Joung Joo Lee, San Jose, CA (US); William Johanson, Gilroy, CA (US); Keith A. Miller, Mountain View, CA (US); Alan A. Ritchie, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 301 days.

(21) Appl. No.: 13/837,261

(22) Filed: Mar. 15, 2013

(65) Prior Publication Data

US 2014/0263169 A1    Sep. 18, 2014

(51) Int. Cl.
```
C23C 14/50      (2006.01)
C23C 16/458     (2006.01)
H01J 37/34      (2006.01)
H01L 21/3065    (2006.01)
H01L 21/683     (2006.01)
C23C 14/34      (2006.01)
H01L 21/687     (2006.01)
H01J 37/32      (2006.01)
```

(52) U.S. Cl.
CPC .............. *C23C 14/34* (2013.01); *C23C 14/50* (2013.01); *C23C 16/4585* (2013.01); *H01J 37/32091* (2013.01); *H01J 37/34* (2013.01); *H01L 21/3065* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 5,213,658 A * | 5/1993 | Ishida | 216/67 |
| 5,660,673 A * | 8/1997 | Miyoshi | 156/345.51 |
| 5,922,133 A * | 7/1999 | Tepman et al. | 118/720 |
| 6,709,547 B1 * | 3/2004 | Ni et al. | 156/345.51 |
| 2006/0037937 A1 * | 2/2006 | Mitsugi et al. | 216/37 |
| 2007/0111339 A1 * | 5/2007 | Wege et al. | 438/10 |
| 2009/0162952 A1 * | 6/2009 | Liu et al. | 438/9 |
| 2014/0273483 A1 | 9/2014 | Ge et al. | |

* cited by examiner

*Primary Examiner* — Anita Alanko
(74) *Attorney, Agent, or Firm* — Moser Taboada; Alan Taboada

(57) ABSTRACT

In some embodiments, a method for processing a substrate in a process chamber having a substrate support configured to move in a direction perpendicular to a top surface of a cover ring of a process kit may include positioning the substrate support in a first position such that a top surface of the substrate is positioned about 3 mm above to about 10 mm below a top surface of a cover ring of a process kit disposed about the periphery of the substrate support; performing a plasma deposition process while the substrate support is in the first position; moving the substrate support to a second position such that the top surface of the substrate is disposed about 3 mm below to about 15 mm above the top surface of the cover ring; and performing a plasma etch process while the substrate support is in the second position.

10 Claims, 4 Drawing Sheets

METHODS FOR PROCESSING A SUBSTRATE USING MULTIPLE SUBSTRATE SUPPORT POSITIONS

FIELD

Embodiments of the present invention generally relate to a semiconductor substrate processing.

BACKGROUND

High frequency radio frequency (RF) plasma processes may produce a higher ionization ratio, as compared to other conventional plasma processes (e.g., such as a DC plasma process), thereby providing more flexibility and a wider range of process applications. However, the inventors have observed that, when performing multiple processes sequentially (e.g., a deposition process followed by a subsequent etch process), non-uniform process results may undesirably be obtained.

Therefore, the inventors have provided an improved method for processing substrates.

SUMMARY

Embodiments of methods for processing a substrate are provided herein. In some embodiments, a method for processing a substrate in a process chamber having a substrate support configured to move in a direction perpendicular to a top surface of a cover ring of a process kit may include positioning the substrate support in a first position such that a top surface of the substrate is positioned about 3 mm above to about 10 mm below a top surface of a cover ring of a process kit disposed about the periphery of the substrate support; performing a plasma deposition process within the process chamber while the substrate support is in the first position; moving the substrate support to a second position such that the top surface of the substrate is disposed about 3 mm below to about 15 mm above the top surface of the cover ring, wherein the second position is different from the first position; and performing a plasma etch process within the process chamber while the substrate support is in the second position.

In some embodiments, a method for processing a substrate disposed on a substrate support may include positioning the substrate support in a first position such that a top surface of the substrate is positioned about 3 mm above to about 10 mm below a top surface of a cover ring disposed about the periphery of the substrate support; performing a plasma deposition process within the process chamber while the substrate support is in the first position to deposit a material on the substrate; subsequently moving the substrate support to a second position such that the top surface of the substrate is disposed about 3 mm below to about 15 mm above the top surface of the cover ring; and performing a plasma etch process within the process chamber while the substrate support is in the second position, wherein the plasma etch process removes at least a portion of the material deposited during the plasma deposition process.

In some embodiments, a computer readable medium having instructions stored thereon that, when executed, cause a method for processing a substrate in a process chamber having a substrate support configured to move in a direction perpendicular to a top surface of a cover ring of a process kit to be performed, where the method may include positioning the substrate support in a first position such that a top surface of the substrate is positioned about 3 mm above to about 10 mm below a top surface of a cover ring of a process kit disposed about the periphery of the substrate support; performing a plasma deposition process within the process chamber while the substrate support is in the first position; moving the substrate support to a second position such that the top surface of the substrate is disposed about 3 mm below to about 15 mm above the top surface of the cover ring, wherein the second position is different from the first position; and performing a plasma etch process within the process chamber while the substrate support is in the second position.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
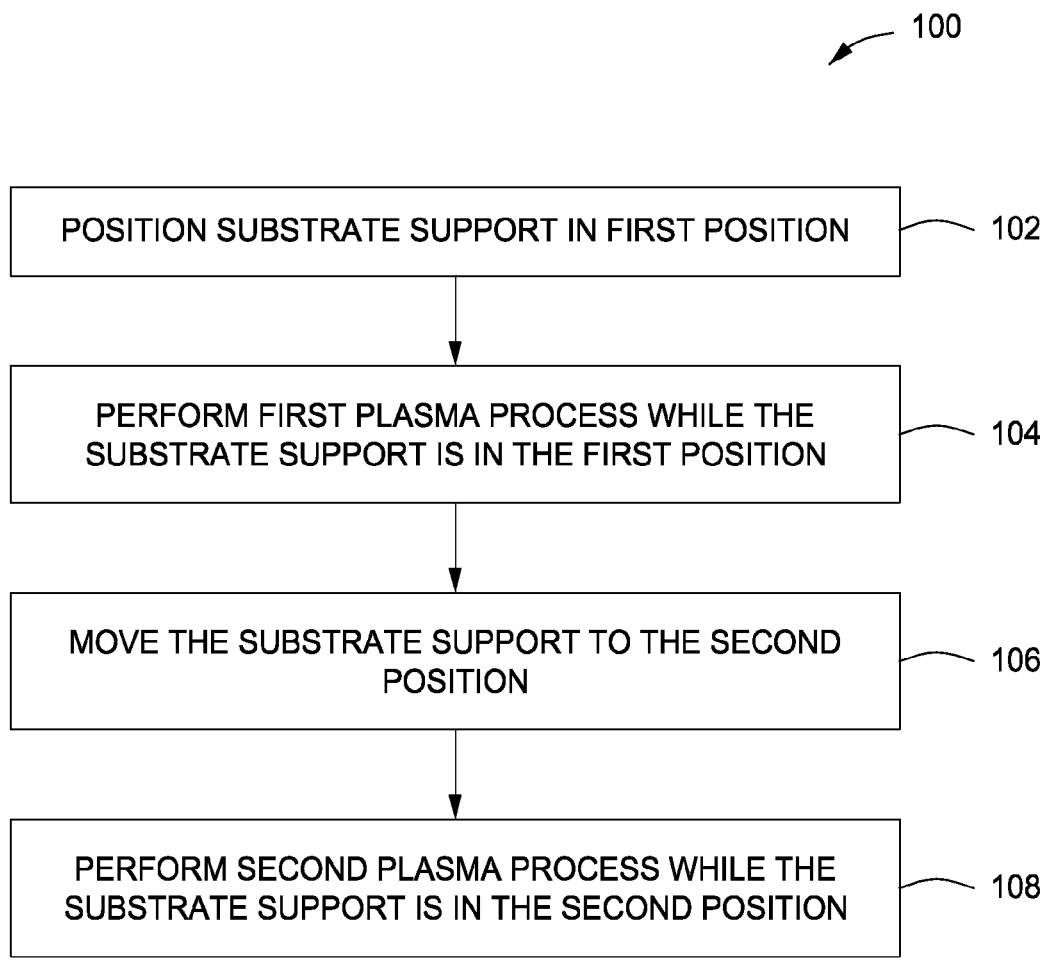
FIG. 1 is a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for processing a substrate are provided herein. In at least some embodiments, the inventive methods may advantageously provide more uniform processing results when performing sequential processes, such as deposition and etch processes, on a substrate in a single process chamber. For example, the inventive methods may advantageously reduce or eliminate local ion flux changes within a plasma proximate the outer edge of the substrate, thereby improving process results, such as etch uniformity proximate the outer edge of the substrate.

The inventive method may advantageously be performed in a physical vapor deposition (PVD) chamber. For example, in a PVD chamber, sequential processing may be performed to alternately deposit material on a substrate and then etch away some of the deposited material. The sequential deposition and etch process can be used to deposit material in desired locations of a substrate, for example to coat or fill a feature disposed on the substrate (such as a via or trench), while limiting or eliminating deposition of the materials in undesired locations on the substrate, for example to prevent closing off a via.

Figure 2A:
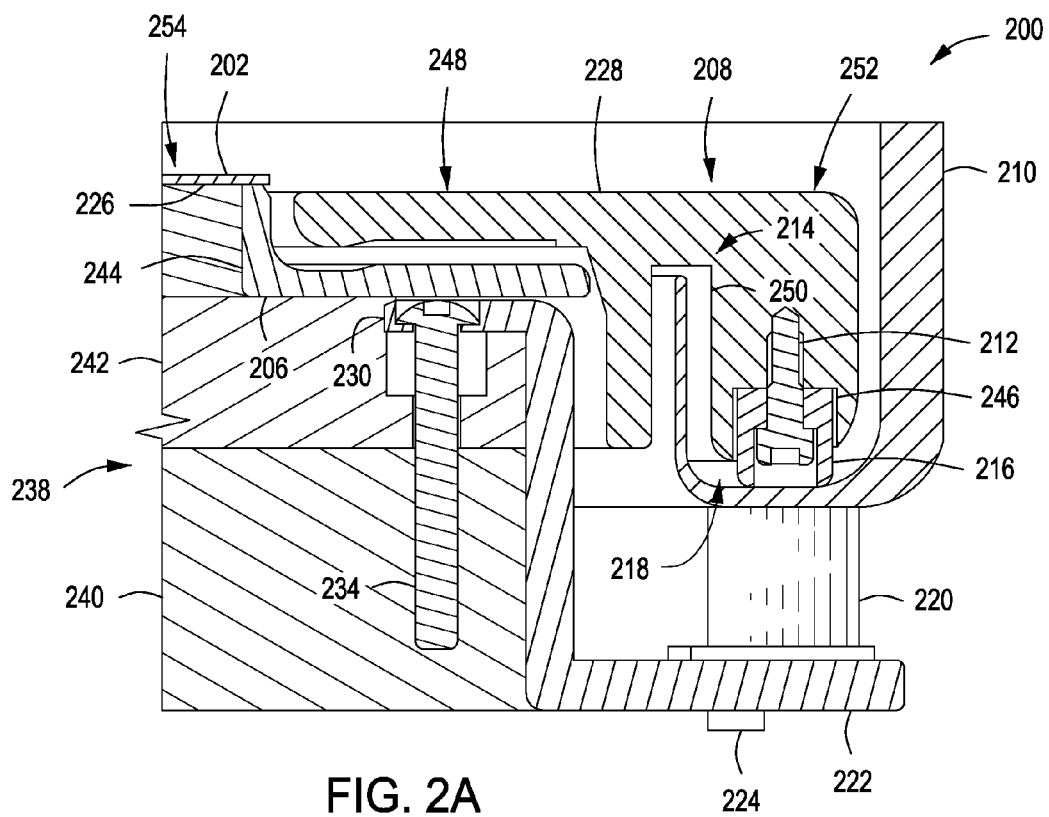
FIGS. 2A-B depict a portion of a process chamber during various stages of a method for processing a substrate in accordance with some embodiments of the present invention.

Referring to FIG. 1, the method 100 generally begins at 102, where a substrate support 200 is positioned in a first position, such as shown in FIG. 2A. The first position may be any position suitable to perform a first process (such as the processes discussed below). For example, in some embodiments, the substrate support 200 may be positioned such that a substrate 202 disposed on a substrate supporting surface 226 of the substrate support 200 is at least partially disposed above, or in some embodiments, at least partially disposed below, a top surface 248 of a cover ring 208 disposed about the substrate support 200. In such embodiments, a top surface 254 of the substrate 202 may be positioned about 3 mm above to about 10 mm below, or in some embodiments, about 1.5 mm below, the top surface 248 of the cover ring 208.

The substrate support 200 may be any type of substrate support 200 suitable for semiconductor substrate fabrication, for example, such as the substrate supports shown in FIG. 2 and/or described below with respect to FIG. 4. In some embodiments, the substrate support 200 may generally include a body 238 having the substrate supporting surface 226, a deposition ring 206 and a housing 222 disposed about at least a portion of the body 238.

In some embodiments, the body 238 may comprise one or more layers (three layers 240, 242, 244 shown) disposed atop one another, forming the body 238. For example, in some embodiments, the substrate support 200 may comprise a first layer 244 fabricated from a dielectric material and having an electrode embedded therein to provide chucking power to facilitate securing the substrate 202 on the substrate support surface 226 (e.g., an electrostatic chuck). The dielectric material may be any process compatible dielectric material, for example, a ceramic such as aluminum oxide ($Al_2O_3$), silicon nitride (SiN), or the like. Additional layers (e.g., the second layer 242 and third layer 240) may include one or more conductive layers disposed below the first layer 244 configured to, for example, be part of an RF electrode, or the like which may be used to provide RF energy to the substrate support 200.

In some embodiments, the body 238 may be at least partially surrounded by a housing 222. When present, the housing 222 may protect one or more components of the body 238 from damage and/or contamination during processing. In some embodiments, a portion of the housing 222 may be supported by the body 238 and held in place via, for example, a fastener 234 (e.g., a bolt, screw, rivet, or the like). In such embodiments, the body 238 may comprise a hole 236 configured to receive the fastener 234. In some embodiments, a portion of the housing 222 may rest within a notch 230 formed in the body 238, such as shown in FIG. 2A.

When present, the deposition ring 206 is disposed about the periphery of the substrate support surface 226 and at least partially beneath the substrate 202 when the substrate is disposed atop the substrate support 200. The deposition ring 206 protects the body 238 from damage and/or contamination from processing.

The cover ring 208 is generally disposed about the substrate support 200. The cover ring 208 protects other chamber components (e.g., portions of the substrate support 200, the shield 210, or the like) from damage and/or contamination from processing. The cover ring 208 may be fabricated from any process compatible material, for example, such as aluminum oxide (Al2O3), silicon nitride (SiN), aluminum (Al), stainless steel (SST), or the like.

The cover ring 208 generally includes a body 252 having an inwardly extending portion 228 that extends inwardly to an area proximate a peripheral edge of the substrate support 200. In some embodiments, the cover ring 208 may comprise one or more features to facilitate maintaining the cover ring 208 in a desired position during processing. For example, in some embodiments, the cover ring 208 may comprise a channel 214 formed in a bottom portion of the cover ring 208 and configured to interface with an end 250 of the shield 210. In such embodiments, the cover ring 208 may be at least partially supported and held in place by the shield 210. In some embodiments, a spacer 216 to provide a gap 218 between the cover ring 208 and the shield 210. In some embodiments, the spacer 216 may be positioned within a cavity 246 formed in the cover ring 208 and coupled to the cover ring 208 via, for example, a fastener 212 (e.g., a bolt, screw, rivet, or the like). In some embodiments, the spacer 216 may be fabricated from an electrically insulating material (e.g., a dielectric) to electrically isolate the cover ring 208 from the shield 210.

The shield 210 surrounds the cover ring 208 and extends upwards along walls of the process chamber (e.g., as described below with respect to FIG. 4). In some embodiments, the shield 210 may be grounded via an electrical coupling with the housing 222. In such embodiments, a conductive member 220 (e.g., a grounding strap) may couple the shield 210 to the housing 222. The conductive member 220 may be fabricated from any process compatible conductive material, for example such as stainless steel (SST). In some embodiments, the conductive material may be flexible to facilitate continuous coupling of the shield 210 to the housing 222 during movement of the substrate support 200. In some embodiments, one or more fasteners (one fastener 224 shown) may facilitate coupling the shield 210 to the housing 222.

Next, at 104 a first plasma process is performed while the substrate support is in the first position. The first plasma process may be any plasma process used in semiconductor substrate fabrication. For example, in some embodiments, the first plasma process may be a deposition process (e.g., physical vapor deposition such as a high frequency, high pressure physical vapor deposition process, or the like). As used herein, high frequency refers to a frequency of about 13.56 to about 60 MHz. The inventors have observed that when maintaining the substrate support in the first position (e.g., where the substrate is at least partially disposed above a top surface 248 of the inwardly extending portion 228 as shown in FIG. 2A) the inwardly extending portion 228 does not overlap or cover any portion of the substrate 202 from any angle, thus advantageously casting no "shadow" over the substrate 202 during the deposition process, which could negatively impact the uniformity of the deposition process.

Figure 3A:
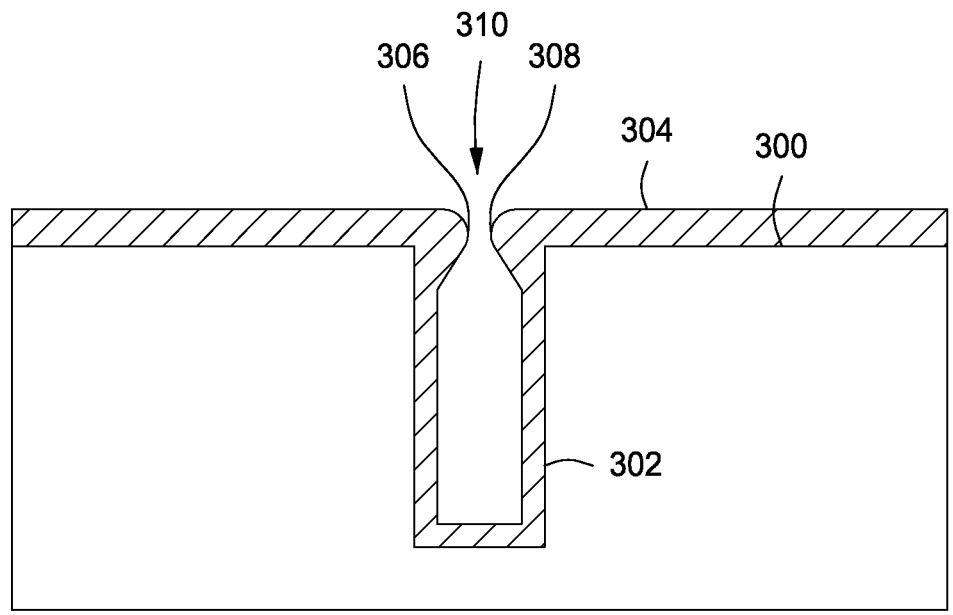
FIGS. 3A-B depict a portion of a substrate during various stages of a method for processing a substrate in accordance with some embodiments of the present invention.

Referring to FIG. 3A, in some embodiments, the deposition process may deposit a layer 304 atop one or more surfaces of a substrate 300, for example, such as shown in FIG. 3A. The substrate 300 may be any type of substrate suitable for the fabrication of a semiconductor device. For example, the substrate 300 may be a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 300 may be a semiconductor wafer, such as a 200, 300 or 450 mm semiconductor wafer. In some embodiments, the substrate 300 may comprise one or more layers (not shown), for example, such as dielectric layers, oxide layers, nitride layers, or the like. In addition, in some embodiments the substrate 300 may comprise one or more features (one feature 302 shown) formed in the substrate 300, for example, such as a trench, via, dual damascene structure, or the like. In some embodiments, the one or more features may be high aspect ratio features having, for example, a height to width aspect ratio of about 3:1 to about 6:1.

Next, at 106, the substrate support 200 is positioned in a second position, such as shown in FIG. 2A. The second position may be any position suitable to perform a process (such as the processes discussed below) and, in some embodiments, is different from the first position. For example, in some embodiments, the substrate support 200 may be positioned such that a substrate 202 disposed on a substrate supporting surface 226 of the substrate support 200 is at least partially disposed beneath, or in some embodiments, at least partially disposed above, a top surface 248 of a inwardly extending portion 228 of a cover ring 208. In such embodiments, the top surface 254 of the substrate 202 may be positioned about 3 mm below to about 15 mm above, or in some embodiments, about 9 mm above, the top surface 248 of the cover ring 208.

Figure 3B:
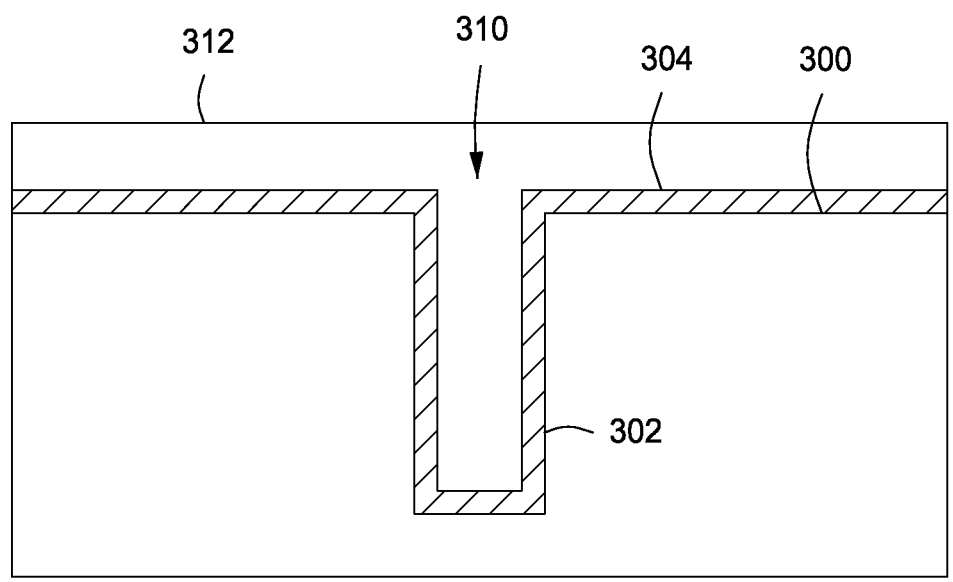

Next, at 108, a second plasma process is performed on the substrate while the substrate support is in the second position. The second plasma process may be any plasma process used in semiconductor substrate fabrication. For example, in some embodiments, the second plasma process may be an etch process (e.g., a high frequency and/or low pressure plasma etch process, or the like). In some embodiments, the etch process may be utilized to remove portions of the layer 304 (e.g., inwardly extending portions 306, 308 shown in FIG. 3A) that extend over the opening 310 of the feature 302, for example as shown in FIG. 3B. Removing such portions of the layer 304 may reduce or eliminate voids or empty spaces within the feature when depositing subsequent layers (e.g., a fill layer such as a metal layer 312 described below).

Figure 2B:
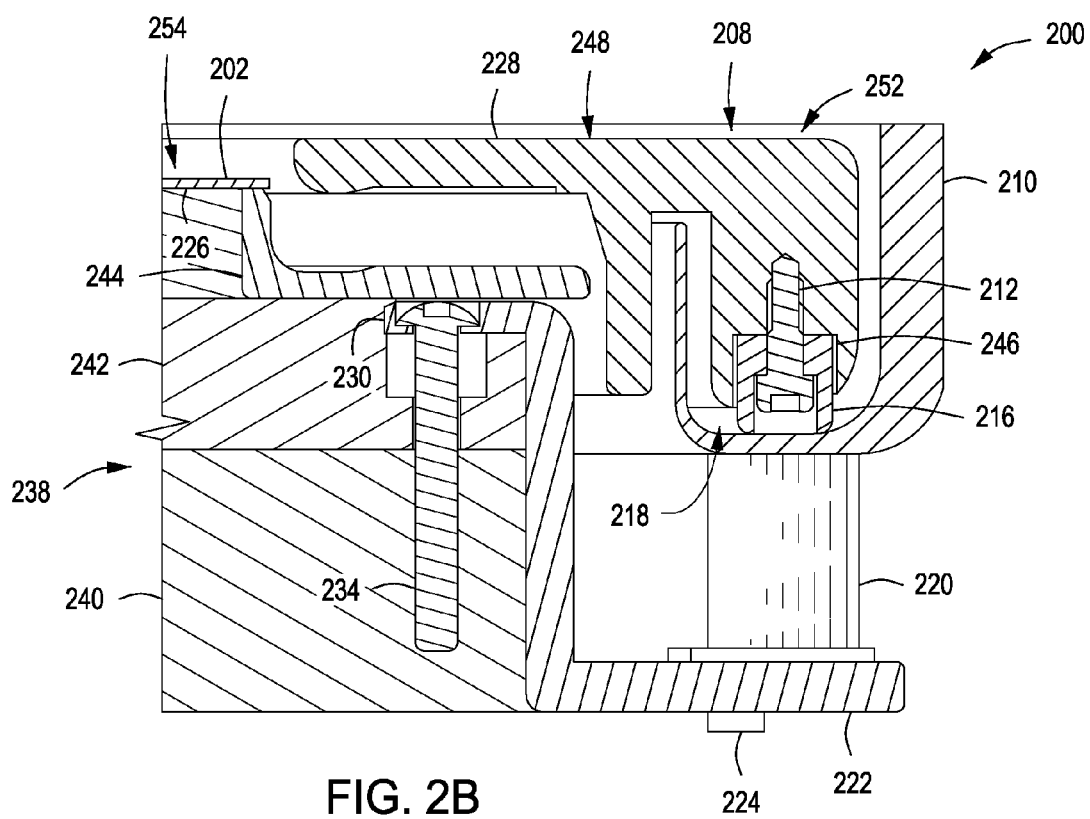

The inventors have observed that when maintaining the substrate support in the second position (e.g., where the substrate is at least partially disposed beneath a top surface 248 of the inwardly extending portion 228 as shown in FIG. 2B) the inwardly extending portion 228 shields an outer edge of the substrate 202, thus casting a "shadow" over the substrate 202 during the etch process. By positioning the substrate support 200 in such a manner, the inwardly extending portion 228 reduces or eliminates local ion flux change within the plasma proximate the outer edge of the substrate 202 that is typically produced during plasma etching processes. Such reduction or elimination of the local ion flux improves etch uniformity proximate the outer edge of the substrate 202, as compared to conventional plasma etching processes.

After performing the second plasma process while the substrate support is in the second position at 108, the process generally ends and the substrate may proceed for further processing. For example, in some embodiments, the substrate support may be moved to another position (e.g., returning back to the first position shown in FIG. 2A) and an additional deposition process may be performed to deposit another layer and/or additional material atop the substrate. For example, in some embodiments, the additional deposition process may be performed to deposit a layer having a desired thickness or to fill the feature 302 with a metal layer 312 (e.g., copper (Cu), or the like) such as shown in FIG. 3B. In some embodiments, following the additional deposition process, the substrate support may be moved back to the second position and an additional etch process may be performed.

Figure 4:
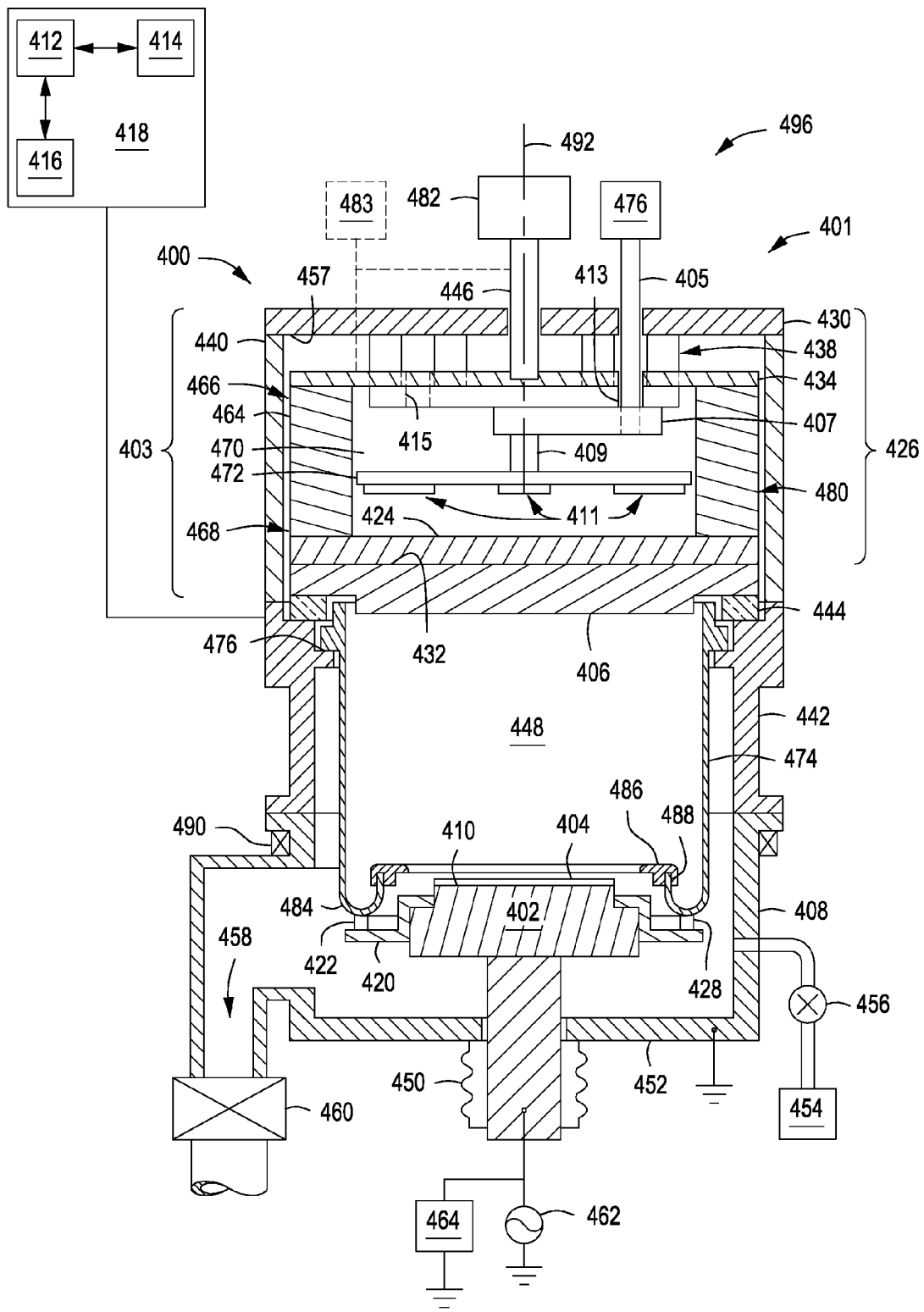
FIG. 4 depicts a schematic view of a process chamber suitable for performing a method for processing a substrate in accordance with some embodiments of the present invention.

FIG. 4 depicts a schematic view of a process chamber suitable for performing the method described above in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive method disclosed herein.

The process chamber 400 contains a substrate support pedestal 402 for receiving a substrate 404 thereon, and a sputtering source, such as a target 406. The substrate support pedestal 402 may be located within a grounded chamber wall 408, which may be a chamber wall (as shown) or a grounded shield (a grounded shield 440 is shown covering at least some portions of the process chamber 400 above the target 406). In some embodiments, the grounded shielded 440 could be extended below the target to enclose the pedestal 402 as well.

The substrate support pedestal 402 has a substrate support surface 410 facing the principal surface of the target 406 and supports the substrate 404 to be processed. In some embodiments, a housing 420 may be disposed about at least a portion of the substrate support pedestal 402. In such embodiments, one or more conductive members 422, 428 (e.g., one or more grounding straps) may couple the grounded shield 440 to the housing 420. The substrate support pedestal 402 may support the substrate 404 in a processing volume 448 of the process chamber 400. The processing volume 448 is defined as the region above the substrate support pedestal 402 during processing (for example, between the target 406 and the substrate support pedestal 402 when in a processing position).

In some embodiments, the substrate support pedestal 402 may be vertically movable through a bellows 450 connected to a bottom chamber wall 452 to allow the substrate 404 to be transferred onto the substrate support pedestal 402 through a load lock valve (not shown) in the lower portion of the process chamber 400 and thereafter raised to one or more positions for processing (e.g., as described above).

One or more processing gases may be supplied from a gas source 454 through a mass flow controller 456 into the lower part of the process chamber 400. An exhaust port 458 may be provided and coupled to a pump (not shown) via a valve 460 for exhausting the interior of the process chamber 400 and facilitating maintaining a desired pressure inside the process chamber 400.

In some embodiments, one or more power sources (an RF power source 462 and DC power source 464 shown) may be coupled to the substrate support pedestal 402. When present, the RF power source 462 may be coupled to the substrate support pedestal 402 to induce a negative DC bias on the substrate 404. In addition, in some embodiments, a negative DC self-bias may form on the substrate 404 during processing.

In some embodiments, the process chamber 400 may further include a grounded shield 474 connected to a ledge 476 of the adapter 442. The adapter 442 in turn is sealed and grounded to chamber wall 408. Generally, the grounded shield 474 extends downwardly along the walls of the adapter 442 and the chamber wall 408 downwardly to below an upper surface of the substrate support pedestal 402 and returns upwardly until reaching an upper surface of the substrate support pedestal 402 (e.g., forming a u-shaped portion 484 at the bottom). Alternatively, the bottommost portion of the shield need not be a u-shaped portion 484 and may have any suitable shape. A cover ring 486 rests on the top of an upwardly extending lip 488 of the grounded shield 474. An additional deposition ring (not shown) may be used to shield the periphery of the substrate 404 from deposition.

In some embodiments, a magnet 490 may be disposed about the process chamber 400 for selectively providing a magnetic field between the substrate support pedestal 402 and the target 406. For example, as shown in FIG. 4, the magnet 490 may be disposed about the outside of the chamber wall 408 in a region just above the substrate support pedestal 402. In some embodiments, the magnet 490 may be disposed additionally or alternatively in other locations, such as adjacent the adapter 442. The magnet 490 may be an electromagnet and may be coupled to a power source (not shown) for controlling the magnitude of the magnetic field generated by the electromagnet.

The chamber lid 401 generally includes the grounding assembly 403 disposed about a target assembly 426. The grounding assembly 403 may include a grounding plate 430 having a first surface 457 that may be generally parallel to and opposite a backside of the target assembly 426. The grounded shield 440 may extend from the first surface 457 of the grounding plate 430 and surround the target assembly 426.

The target assembly 426 may include a source distribution plate 434 opposing a backside 432 of the target 406 and electrically coupled to the target 406 along a peripheral edge of the target 406. The target 406 may comprise a source material to be deposited on the substrate 404 during sputtering, such as a metal, metal oxide, metal alloy, magnetic material, or the like. In some embodiments, the target 406 may include a backing plate 424 to support the target 406. The backing plate 424 may comprise a conductive material, such as copper-zinc, copper-chrome, or the same material as the target, such that RF, and optionally DC, power can be coupled to the target 406 via the backing plate 424. Alternatively, the backing plate 424 may be non-conductive and may include conductive elements (not shown) such as electrical feedthroughs or the like.

A conductive member 436 may be disposed between the source distribution plate 434 and the backside 432 of the target 406 to propagate RF energy from the source distribution plate 434 to the peripheral edge of the target 406. The conductive member 436 may be cylindrical and tubular, with a first end 466 coupled to a target-facing surface of the source distribution plate 434 proximate the peripheral edge of the source distribution plate 434 and a second end 468 coupled to the backside 432 of the target 406 proximate the peripheral edge of the target 406. In some embodiments, the second end 468 is coupled to the backing plate 424 proximate the peripheral edge of the backing plate 424.

The target assembly 426 may include a cavity 470 disposed between the backside of the target 406 and the source distribution plate 434. The cavity 470 may at least partially house a magnetron assembly 496. The cavity 470 is at least partially defined by the inner surface of the conductive member 436, a target facing surface of the source distribution plate 434, and a source distribution plate facing surface (e.g., backside 432) of the target 406 (or backing plate 424). In some embodiments, the cavity 470 may be at least partially filled with a cooling fluid, such as water ($H_2O$) or the like.

An insulative gap 480 is provided between the grounding plate 430 and the outer surfaces of the source distribution plate 434, the conductive member 436, and the target 406 (and/or backing plate 424). The insulative gap 480 may be filled with air or some other suitable dielectric material, such as a ceramic, a plastic, or the like. A distance between the grounding plate 430 and the source distribution plate 434 may depend on the dielectric material between the grounding plate 430 and the source distribution plate 434. Where the dielectric material is predominantly air, the distance between the grounding plate 430 and the source distribution plate 434 should be between about 5 to about 40 mm.

The grounding assembly 403 and the target assembly 426 may be electrically separated by one or more of insulators 438 disposed between the first surface 457 of the grounding plate 430 and the backside of the target assembly 426, e.g., a non-target facing side of the source distribution plate 434.

The target assembly 402 has the RF power source 482 connected to an electrode 446 (e.g., a RF feed structure). The RF power source 482 may include an RF generator and a matching circuit, for example, to minimize reflected RF energy reflected back to the RF generator during operation. For example, RF energy supplied by the RF power source 482 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 483 may be coupled to the target assembly 426 to provide additional energy to the target 406 during processing. In some embodiments, the second energy source 483 may be a DC power source to provide DC energy, for example, to enhance a sputtering rate of the target material (and hence, a deposition rate on the substrate). In some embodiments, the second energy source 483 may be a second RF power source, similar to the RF power source 482, to provide RF energy, for example, at a second frequency different than a first frequency of RF energy provided by the RF power source 482. In embodiments where the second energy source 483 is a DC power source, the second energy source may be coupled to the target assembly 426 in any location suitable to electrically couple the DC energy to the target 406, such as the electrode 446 or some other conductive member (such as the source distribution plate 434). In embodiments where the second energy source 483 is a second RF power source, the second energy source may be coupled to the target assembly 426 via the electrode 446.

The grounding plate 430 may comprise any suitable conductive material, such as aluminum, copper, or the like. Open spaces between the one or more insulators 438 allow for RF wave propagation along the surface of the source distribution plate 434. In some embodiments, the one or more insulators 438 may be symmetrically positioned with respect to a central axis 492 of the process chamber 400 Such positioning may facilitate symmetric RF wave propagation along the surface of the source distribution plate 434 and, ultimately, to a target 406 coupled to the source distribution plate 434. The RF energy may be provided in a more symmetric and uniform manner as compared to conventional PVD chambers due, at least in part, to the central position of the electrode 446.

One or more portions of a magnetron assembly 496 may be disposed at least partially within the cavity 470. The magnetron assembly provides a rotating magnetic field proximate the target to assist in plasma processing within the process chamber 400. In some embodiments, the magnetron assembly 496 may include a motor 498, a motor shaft 405, a gearbox 407, a gearbox shaft 409, and a rotatable magnet (e.g., a plurality of magnets 411 coupled to a magnet support member 472).

In some embodiments (not shown), the magnetron drive shaft may be disposed along the central axis of the chamber, with the RF energy coupled to the target assembly at a different location or in a different manner. As illustrated in FIG. 4, in some embodiments, the motor shaft 405 of the magnetron may be disposed through an off-center opening in the grounding plate 430. The end of the motor shaft 405 protruding from the grounding plate 430 is coupled to a motor 498. The motor shaft 405 is further disposed through a corresponding off-center opening through the source distribution plate 434 (e.g., a first opening 413) and coupled to a gear box 407. In some embodiments, one or more second openings 415 may be disposed though the source distribution plate 434 in a symmetrical relationship to the first opening 413 to advantageously maintain axisymmetric RF distribution along the source distribution plate 434. The one or more second openings 415 may also be used to allow access to the cavity 470 for items such as sensors or the like.

The gear box 407 may be supported by any suitable means, such as by being coupled to a bottom surface of the source distribution plate 434. The gear box 407 may be insulated from the source distribution plate 434 by fabricating at least the upper surface of the gear box 407 from a dielectric material, or by interposing an insulator layer 417 between the gear box 407 and the source distribution plate 434, or the like. The gear box 407 is further coupled to the magnet support member 472 via the gear box shaft 409 to transfer the rotational motion provided by the motor 498 to the magnet support member 472 (and hence, the plurality of magnets 411). The gear box shaft 409 may advantageously be coincident with the central axis 492 of the process chamber 400.

A controller 418 may be provided and coupled to various components of the process chamber 400 to control the operation thereof. The controller 418 includes a central processing unit (CPU) 412, a memory 414, and support circuits 416. The controller 418 may control the process chamber 400 directly, or via computers (or controllers) associated with particular process chamber and/or support system components. The controller 418 may be one of any form of general-purpose computer processor that can be used in an industrial setting for controlling various chambers and sub-processors. The memory, or computer readable medium, 414 of the controller 418 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 416 are coupled to the CPU 412 for supporting the processor in a conventional manner. These circuits include cache, power supplies, clock circuits, input/output circuitry and subsystems, and the like. Inventive methods as described herein may be stored in the memory 414 as software routine that may be executed or invoked to control the operation of the process chamber 400 in the manner described herein. The software routine may also be stored and/or executed by a second CPU (not shown) that is remotely located from the hardware being controlled by the CPU 412.

Thus, embodiments of a method for processing a substrate using multiple substrate support positions have been provided herein. In at least some embodiments, the inventive method may advantageously improving etch uniformity while performing sequential deposition and etch processes.

While the foregoing is directed to embodiments of the present invention, other and further embodiments of the invention may be devised without departing from the basic scope thereof.

The invention claimed is:

1. A method for processing a substrate in a process chamber having a substrate support configured to move in a direction perpendicular to a top surface of a cover ring, the method comprising:
    moving the substrate support to a first position such that a top surface of the substrate is positioned about 3 mm above to about 10 mm below the top surface of the cover ring disposed about a periphery of the substrate support;
    performing a plasma deposition process within the process chamber while the substrate support is in the first position;
    moving the substrate support to a second position such that the top surface of the substrate is disposed about 3 mm below to about 15 mm above the top surface of the cover ring, wherein the second position is different from the first position; and
    performing a plasma etch process within the process chamber while the substrate support is in the second position, wherein a position of the cover ring is not changed between the plasma deposition process and the plasma etch process performed.

2. The method of claim 1, wherein positioning the substrate support in the first position comprises positioning the substrate support such that the top surface of the substrate is positioned beneath the top surface of the cover ring, and wherein positioning the substrate support in the second position comprises positioning the substrate support such that the top surface of the substrate is above the top surface of the cover ring.

3. The method of claim 1, wherein the substrate support is moved to the second position subsequent to performing the plasma deposition process.

4. The method of claim 1, wherein the etch process removes at least a portion of material deposited during the deposition process.

5. The method of claim 1, wherein the plasma deposition process is a physical vapor deposition process.

6. The method of claim 1, wherein the plasma deposition process and the plasma etch process are high frequency RF plasma processes utilizing a RF power source operating a frequency of about 13.56 to about 60 MHz.

7. A method for processing a substrate disposed on a substrate support in a process chamber, comprising:
    moving the substrate support to a first position such that a top surface of the substrate is positioned about 3 mm above to about 10 mm below a top surface of a cover ring disposed about a periphery of the substrate support;
    performing a plasma deposition process within the process chamber while the substrate support is in the first position to deposit a material on the substrate;
    subsequently moving the substrate support to a second position such that the top surface of the substrate is disposed about 3 mm below to about 15 mm above the top surface of the cover ring; and
    performing a plasma etch process within the process chamber while the substrate support is in the second position, wherein the plasma etch process removes at least a portion of the material deposited during the plasma deposition process, and wherein a position of the cover ring is not changed between the plasma deposition process and the plasma etch process performed.

8. The method of claim 7, wherein positioning the substrate support in the first position comprises positioning the substrate support such that the top surface of the substrate is positioned beneath the top surface of the cover ring, and wherein positioning the substrate support in the second position comprises positioning the substrate support such that the top surface of the substrate is above the top surface of the cover ring.

9. The method of claim 7, wherein the plasma deposition process is a physical vapor deposition process.

10. The method of claim 7, wherein the plasma deposition process and the plasma etch process are high frequency RF plasma processes utilizing a RF power source operating a frequency of about 13.56 to about 60 MHz.

* * * * *